US005945770A

United States Patent [19]

Hanafy

[11] Patent Number: 5,945,770

[45] Date of Patent: Aug. 31, 1999

[54] MULTILAYER ULTRASOUND TRANSDUCER AND THE METHOD OF MANUFACTURE THEREOF

[75] Inventor: Amin M. Hanafy, Los Altos Hills, Calif.

[73] Assignee: Acuson Corporation, Mountain View, Calif.

[21] Appl. No.: 08/915,476

[22] Filed: Aug. 20, 1997

[51] Int. Cl.[6] ........ H01L 41/08

[52] U.S. Cl. ........ 310/322; 310/334; 310/367; 310/366

[58] Field of Search ........ 310/322, 334, 310/367

[56] References Cited

U.S. PATENT DOCUMENTS

| | | | |
|---|---|---|---|
| 4,096,756 | 6/1978 | Alphonse | 310/317 |
| 4,276,491 | 6/1981 | Daniel | 310/317 |
| 4,354,132 | 10/1982 | Borburgh et al. | 310/334 |
| 4,356,422 | 10/1982 | van Maanen | 310/322 |
| 4,477,783 | 10/1984 | Glenn | 310/334 |
| 4,485,321 | 11/1984 | Klicker et al. | 310/322 |
| 4,712,037 | 12/1987 | Verbeek et al. | 310/323 |
| 5,291,090 | 3/1994 | Dias | 310/334 |
| 5,381,067 | 1/1995 | Greenstein et al. | 310/334 |
| 5,381,385 | 1/1995 | Greenstein | 367/140 |
| 5,389,848 | 2/1995 | Trzaskos | 310/322 |
| 5,415,175 | 5/1995 | Hanafy et al. | 310/367 |
| 5,438,998 | 8/1995 | Hanafy | 310/334 |
| 5,548,564 | 8/1996 | Smith | 310/334 |
| 5,598,051 | 1/1997 | Frey | 310/334 |
| 5,608,692 | 3/1997 | Toda | 310/334 |

FOREIGN PATENT DOCUMENTS

| | | | |
|---|---|---|---|
| 58-48200 | 9/1956 | Japan | 310/322 |

*Primary Examiner*—Thomas M. Dougherty
*Attorney, Agent, or Firm*—Brinks Hofer Gilson & Lione

[57] ABSTRACT

A three crystal ultrasound transducer in which each crystal has a thickness that is measured in the z-range direction that varies as a function of its position along the x-elevation direction. The impedance of the transducer is reduced compared with uniform thickness transducers thereby providing a better electrical match between the ultrasound transducer and the ultrasound system to which it is coupled.

22 Claims, 3 Drawing Sheets

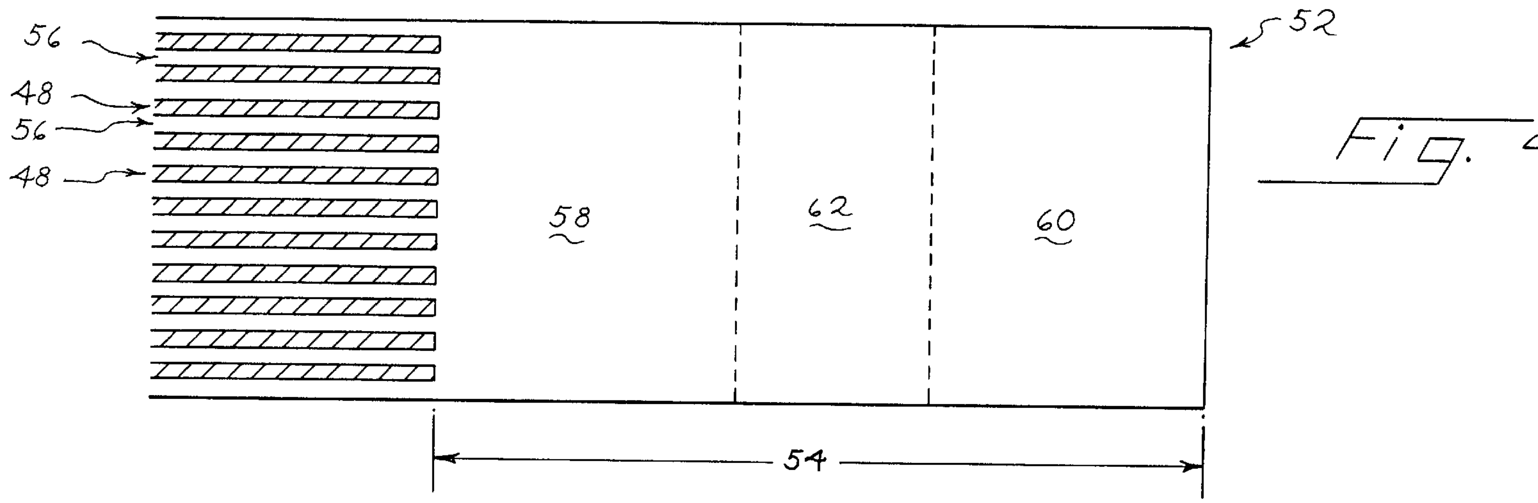

Fig. 4

Fig. 5

ARRAY TYPE AND SERIAL NUMBER

| PARAMETER | BULLET SINGLE LAYER STACK #203 | BULLET SINGLE LAYER STACK #204 | BULLET TWO LAYER STACK #201 | BULLET TWO LAYER STACK #202 | BULLET THREE LAYER STACK R2 |
|---|---|---|---|---|---|
| (a) SINGLE ELEMENT ACOUSTIC IMPEDANCE (Z) AT ANTI-RESONANCE R ± JX | 146-J2.1 | 139-J1.6 | 27-J0.3 | 27.1-J0.2 | 16.56-J0.17 |
| (b) SINGLE ELEMENT CLAMPING CAPACITANCE (C) AT 100 KHz (STACK AVERAGE) | 195 pf | 194 pf | 770 pf | 771 pf | 1658 pf |
| (C) SINGLE ELEMENT ROUND TRIP IMPULSE RESPONSE TO FLAT TARGET AT CENTER FREQUENCY (STACK AVERAGE) | -59.7 dB | -59.9 dB | -54.1 dB | -53.7 dB | -50.81 dB |

MULTILAYER ULTRASOUND TRANSDUCER AND THE METHOD OF MANUFACTURE THEREOF

FIELD OF THE INVENTION

This invention relates to a multilayered ultrasound transducer and the method of manufacture thereof, and, more particularly, to a multilayered ultrasound transducer that has a plurality of piezoelectric layers that are each non-uniform in thickness.

BACKGROUND OF THE INVENTION

Some ultrasound transducers utilize a single-layer of piezoelectric material to form the transducer elements. Single-layer transducers have the disadvantage that when operated at higher frequencies, the layer's impedance increases greatly so that a mismatch in impedances occurs between the transducer and the ultrasound system to which it is coupled. Due to this mismatch of impedances, the transfer of energy to the transducer is decreased due to reflection of energy by the transducer.

Ultrasound transducer having multiple layers of piezoelectric material are also known. In some ultrasound transducers the layers of piezoelectric material are uniform in thickness. These transducers with uniform thickness piezoelectric layers suffer from limited bandwidth and poor signal-to-noise ratio due to higher side lobes, especially in in-depth imaging. In addition, they are limited by the lack of control of the slice thickness in the elevation direction.

U.S. Pat. Nos. 5,415,175 ("the '175 patent")and 5,438,998 ("the '998 patent"), both of which are assigned to the present assignee and are specifically incorporated herein by reference, disclose an ultrasound transducer that has two layers of piezoelectric material stacked one on top of the other in the z-range direction as shown in FIGS. 12 and 13 of the '175 and '998 patents. Each layer has a thickness in the z-range direction and a width in the x-elevation direction extending from a first end to a second end. The thickness of each layer is non-uniform, and more particularly, the thickness is at a maximum at the first and second ends and the thickness is at a minimum at a point about midway therebetween. As shown in FIG. 12, the top layer of piezoelectric material has a concave surface which will face the region of examination when the transducer is in use. The bottom layer also has a concave surface which faces a backing block on which the bottom layer is disposed. In the embodiment shown in FIG. 13 the concave surface of the bottom layer faces the top layer of piezoelectric material.

It is thus desirable to provide an ultrasound transducer that has a reduced impedance and an improved electrical match to the ultrasound system to which it is coupled. It is also desirable to provide an interconnect circuit that is simple in construction, maintains the same number of traces as a single layer design and has all of the traces extending from one side of the transducer.

SUMMARY OF THE INVENTION

According to a first aspect of the invention there is provided a three crystal ultrasound transducer including a first piezoelectric layer having a thickness in a range direction and a width in an elevation direction wherein the width extends from a first end to a second end and the thickness of the first piezoelectric layer is at a maximum at the first and second ends and the thickness is at a minimum at a point about midway between the first and second ends, a second piezoelectric layer disposed on the first piezoelectric layer, the second piezoelectric layer having a thickness in the range direction and a width in the elevation direction, wherein the width extends from a first end to a second end and the thickness of the second piezoelectric layer is at a maximum at the first and second ends and the thickness is at a minimum at a point about midway between the first and second ends, a third piezoelectric layer disposed on the second piezoelectric layer, the third piezoelectric layer having a thickness in the range direction and a width in the elevation direction wherein the width extends from a first end to a second end and the thickness of the third piezoelectric layer is at a maximum at the first and second ends and the thickness is at a minimum at a point about midway between the first and second ends, and an interconnect circuit disposed between the first, second and third piezoelectric layers wherein the interconnect circuit can deliver an excitation signal to the first, second and third piezoelectric layers thereby causing each piezoelectric layer to generate an ultrasound signal.

According to a second aspect of the invention there is provided a three crystal ultrasound transducer including a first piezoelectric layer having a thickness in the range direction and a width in the elevation direction wherein the thickness of the first piezoelectric layer is non-uniform along its width, a second piezoelectric layer disposed on the first piezoelectric layer, the second piezoelectric layer having a thickness in the range direction and a width in the elevation direction wherein the thickness of the second piezoelectric layer is non-uniform along its width, a third piezoelectric layer disposed on the second piezoelectric layer, the third piezoelectric layer having a thickness in the range direction and a width in the elevation direction wherein the thickness of the third piezoelectric layer is non-uniform along its width, and an interconnect circuit disposed between the first, second and third piezoelectric layers wherein the interconnect can deliver an excitation signal to the first, second and third piezoelectric layers thereby causing each piezoelectric layer to generate an ultrasound signal.

According to a third aspect of the invention there is provided a three crystal ultrasound transducer including a first piezoelectric layer, a second piezoelectric layer disposed on the first piezoelectric layer, a third piezoelectric layer disposed on the second piezoelectric layer and an interconnect circuit having a first center pad, a second center pad, and a third center pad on which are disposed the first, second and third piezoelectric layers respectively and a plurality of traces coupled to the first, second and third center pads wherein the plurality of traces extend from the same side of each of the piezoelectric layers.

BRIEF DESCRIPTION OF THE DRAWINGS

FIG. 4 is a view of a signal flex circuit in its unwrapped state.

FIG. 5 is a table listing the parameters measured for two, single-layer non-uniform thickness transducers, two, two-layer non-uniform thickness transducers and a three-layered non-uniform thickness transducer.

DETAILED DESCRIPTION OF THE PRESENTLY PREFERRED EMBODIMENTS

Figure 1:
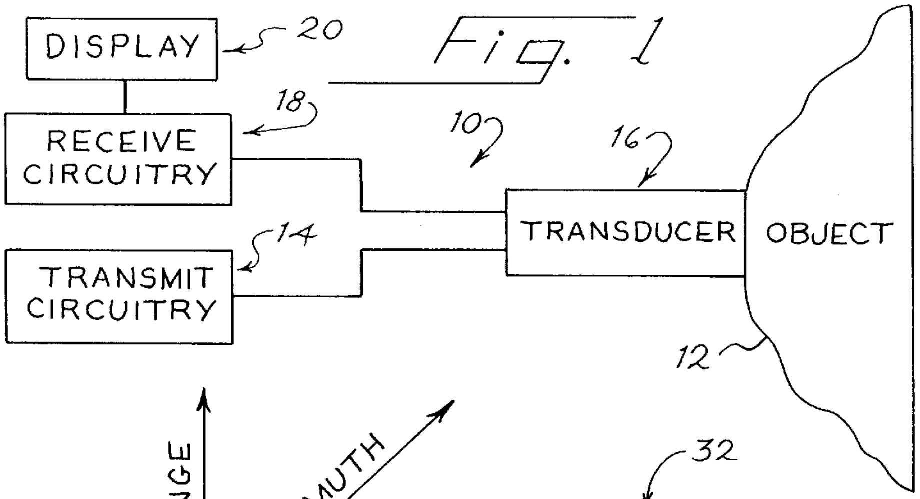
FIG. 1 is a schematic view of an ultrasound system for transmitting and receiving ultrasound signals.

FIG. 1 is a schematic view of an ultrasound system 10 for transmitting and receiving ultrasound signals. The system 10 is used to generate an image of an object 12 or body that is located in a region of examination. The ultrasound system 10 has transmit circuitry 14 for transmitting electrical signals to a transducer 16, receive circuitry 18 for processing signals received by the transducer 16 and a display 20 for displaying the image of the object 12 in the region of examination when the transducer is in use.

Figure 2:
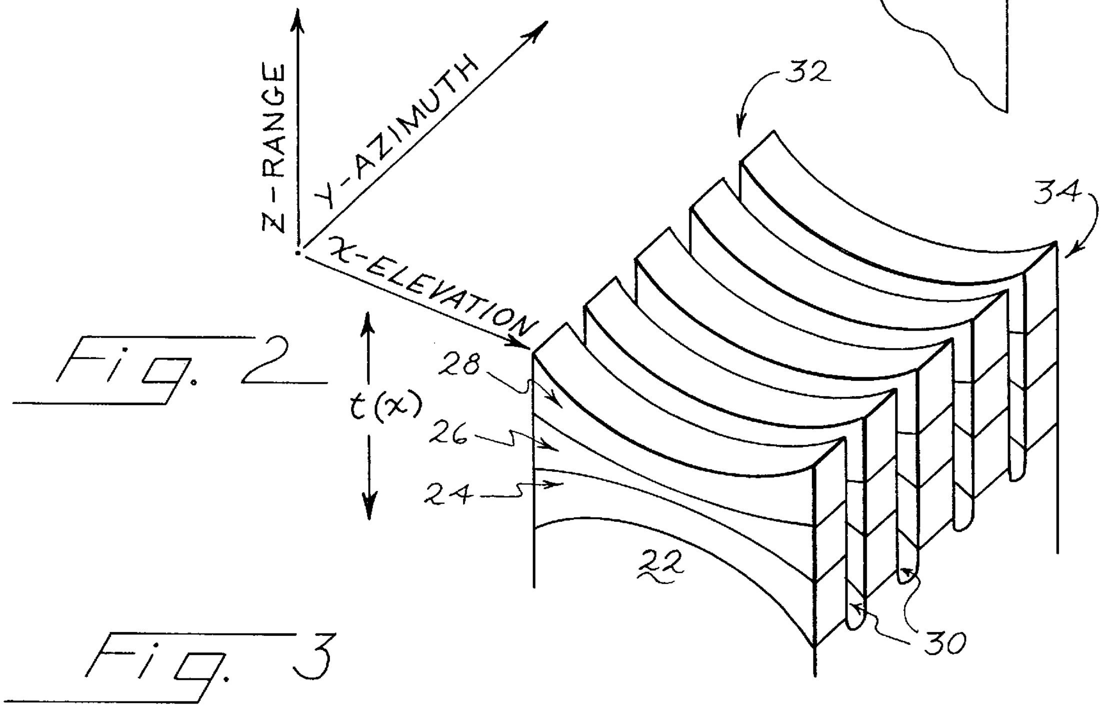
FIG. 2 shows a partial perspective view of a linear transducer array according to a preferred embodiment of the present invention.

FIG. 2 shows a partial perspective view of a portion of a linear transducer array according to a preferred embodiment of the present invention. Not all of the elements that would make up transducer 16 have been illustrated in order to clarify the description of the invention. The linear array includes a backing block 22, a first layer of piezoelectric material 24 disposed on top of the backing block 22, a second layer of piezoelectric material 26 disposed on top of the first layer of piezoelectric material 24, and a third layer of piezoelectric material 28 disposed on top of the second layer of piezoelectric material 26. An interconnect circuit (not shown) is disposed between the backing block 22 and the first layer of piezoelectric material 24, between the first and second layers of piezoelectric material 24 and 26, respectively, and between the third layer of piezoelectric material 28 and an acoustic matching layer (not shown). Kerfs 30 extending in the x-elevation direction separate the transducer elements from one another in the y-azimuth direction so that the transducer elements are sequentially arranged in the y-azimuth direction. In a preferred embodiment the kerfs 30 extend partially into the backing block 22 to electrically and acoustically isolate the transducer elements from one another.

Each of the three-layers of piezoelectric material is identical in dimension. Each layer has a width extending in the x-elevation direction from a first end 32 to a second end 34 and a thickness t(x) extending in the z-range direction. The thickness of each transducer element varies as a function of its position along the x-elevation direction.

Figure 3:
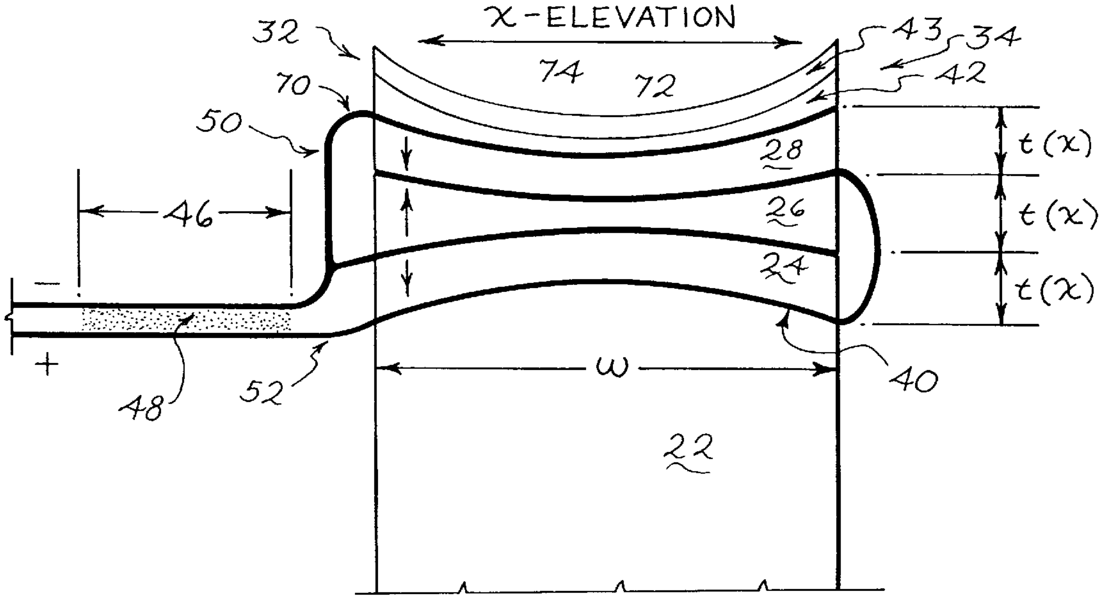
FIG. 3 is a cross-sectional view of a three crystal design according to a preferred embodiment of the present invention.

FIG. 3 is a cross-sectional view of a three crystal design taken along the x-elevation direction according to a preferred embodiment of the present invention. In a preferred embodiment, the backing block 22 has a top surface 40 that is convex in shape. The first layer piezoelectric material 24 is positioned so that its poling direction faces towards the backing block 22 as indicated by the arrow. The second layer of piezoelectric material 26 is disposed so that its poling direction faces away from the backing block 22 as indicated by the arrow and the third layer of piezoelectric material 28 is disposed so that its poling direction faces towards the backing block 22 as indicated by the arrow. Each of the three-layers of piezoelectric material have a width w extending in the x-elevation direction from the first end 32 to the second end 34 of the layers and a thickness t(x) extending in the z-range direction. The thickness t(x) varies as a function of its position along the x-elevation direction and, in a preferred embodiment, the thickness t(x) of each layer is at a maximum at the first and second ends 32 and 34 and the thickness is at a minimum at a point about midway between the first and second ends 32 and 34.

In a preferred embodiment, a first acoustic matching layer 42 and static shield (not shown) are disposed on top of the third layer of piezoelectric material 28. In another preferred embodiment, a second acoustic matching layer 43 is disposed on top of the first acoustic matching layer 42. Preferably, the acoustic matching layer, like the three-layers of piezoelectric material, has a non-uniform thickness. If a second acoustic matching layer is provided, the static shield is disposed over the second acoustic matching layer. In a preferred embodiment, the static shield is a gold-coated mylar layer that is coupled to the transducer chassis ground to prevent radio frequency interference. Such a static shield is commercially available from Sheldahl of Northfield, Minn.

In a preferred embodiment, each of the three-layers of piezoelectric material has a width w of about 14 mm. The maximum thickness of each of the three-layers is about 0.006 inches and the minimum thickness of each layer is about 0.003 inches. In a preferred embodiment, two acoustic matching layers are disposed on top of the third layer of piezoelectric material. Preferably, a high impedance acoustic matching layer is disposed directly on the third layer of piezoelectric material and a low impedance matching layer is disposed on the high impedance matching layer. In a preferred embodiment, the low and high impedance matching layers have a thickness that varies as a function of its position along the x-elevation direction and preferably has a maximum thickness at its outer ends and a minimum thickness at a point about midway between the outer ends. In a preferred embodiment, the minimum thickness of the low impedance matching layer is about 0.0054 inches and its maximum thickness is about 0.0086 inches. The minimum thickness of the high impedance layer is about 0.0048 inches and its maximum thickness is about 0.008 inches. The first, second and third layers of piezoelectric material have a radius of curvature of about 6.420 inches. The low and high impedance acoustic matching layers have a radius of curvature of about 11.123 inches. None of the figures have been drawn to scale.

In a preferred embodiment each transducer element is composed of the following elements. The first, second and third layers are composed of piezoelectric material lead zirconate titanate (PZT), however, they may be composed of other materials such as a composite like polyvinylidene fluoride (PVDF), an electro-restrictive material such as lead magnesium niobate (PMN) or a composite ceramic material or other suitable material. The high impedance matching layer is formed of Dow Corning's epoxy resin DER 332 with Dow Corning's hardener DEH 24 filled with 9 micron alumina oxide particles from Microabrasive of Westfield, Mass., and 1 micron tungsten carbide particles available from Cerac Incorporated of Milwaukee, Wis. The low impedance matching layer is formed of Dow Corning's epoxy resin DER 332 with Dow Corning's hardener DEH 24.

Interposed between the backing block, the first layer 24, the second layer 26, the third layer 28 and the acoustic matching layer 42 is an interconnect circuit 50 (illustrated by the dark lines) which couples the transducer to the transmit and receive circuits 14 and 18 when the transducer is in use. The interconnect circuit 50 is preferably divided into two parts, a signal flex circuit 52 and a ground flex circuit 70 with the common part between the signal and ground flex circuits designated as 46.

FIG. 4 is a view of the signal flex circuit 52 in its unwrapped state. The signal flex circuit 52 has an area 54 that is formed solely by a layer of copper. In a preferred embodiment the layer of copper 54 has a thickness ranging from about 0.0002 inches to about 0.0005 inches, and more preferably has a thickness of about 0.0003 inches, extending from one side of area 54 is a plurality of traces 56.

The individual traces 56 are preferably copper which has been disposed on a polyimide film 48 such as KAPTON™ which is commercially available from the E. I. DuPont Company. The individual traces 56 are electrically isolated from one another by the layer of polyimide 48 as is well known. With reference to both FIGS. 3 and 4, the area 54 has a first center pad area 58 that, when the transducer is constructed, will be disposed between the backing block 22 and the first layer of piezoelectric material 24. The area 54 has a second center pad area 60 that, when the transducer is constructed, will be disposed between the second layer 26 and the third layer 28. An area 62 connects the first and second center pads 58 and 60 and simply wraps around a side of the first and second layers 24 and 26 when the transducer is constructed as shown in FIG. 3. Because no traces are formed in area 54 the construction of the transducer is simplified. Alignment is only required between the kerfs 30 that define the transducer elements and the traces 56 in the signal flex circuit 52.

Referring to FIG. 3 the ground flex circuit 70 has a first and second branch 72 and 74, respectively, that are formed by a layer of copper having a thickness ranging from about 0.0002 inches to about 0.0005 inches and, more preferably, has a thickness of about 0.0003 inches. When the transducer is constructed both the ground and the signal traces extend from the same side of the transducer and are joined at area 46 which has the signal traces 56 on the underside thereof separated from the layer of copper that forms the ground plane by the layer of polyimide 48.

When the transducer is coupled to the ultrasound system and an excitation signal is output by the transmit circuit 14, the signal flex circuit 52 delivers the excitation signal to the first, second and third layers 24, 26 and 28. Upon receipt of the excitation signal, the first, second and third layers 24, 26 and 28 convert the excitation signal to a pressure wave which is emitted from the transducer as an ultrasound beam. The ultrasound beam is directed into a region of examination to which the transducer is pointed. As the ultrasound beam encounters various structures in the region of examination, ultrasound waves are reflected back to the transducer. The reflected ultrasound waves are converted to electrical signals by the first, second and third layers and delivered to the receive circuitry 18 where they are processed and displayed on display 20.

To construct the transducer shown in FIG. 2, the first, second, third layers 24, 26 and 28 and signal and ground flex circuits are assembled as shown in FIG. 3. Kerfs 30 (see FIG. 2) are diced in the x-elevation direction through the acoustic matching layers, the ground and signal flex circuits and through the first, second and third layers and preferably partially into the backing block as is well known. The kerfs 30 are located to cut between the ground and signal traces of the ground and signal flex circuits so that each trace leads to an individual transducer element. Because the signal and ground traces extend from the same side of the transducer and the area 54 of the signal flex circuit does not have any traces, the process of correctly positioning the kerfs 30 is simplified.

It has been found that a multilayered transducer constructed of piezoelectric layers having non-uniform thickness in the x-elevation direction provides better matching of the transducer to the ultrasound system which results in increased bandwidth and improved signal-to-noise ratio. In particular, because the layers of piezoelectric material are assembled based upon their poling direction which are acoustically in series and electrically in parallel, the following relationships apply based upon the KIM or Mason models:

$$\xi(N)=\xi(1)N^2$$

$$Z(N)=Z(1)N^2$$

$$V(N)=V(1)N,$$

where $\xi(N)$ and $\xi(1)$ are the dielectric constants for N layers and for a single-layer respectively, Z(N) and Z(1) are acoustic impedance for N layers and for a single-layer respectively, and V(N) and V(1) are applied voltage for N layers and for a single-layer respectively. It can be seen that the impedance decreases significantly with a multilayered construction.

FIG. 5 is a table listing the parameters measured for two, single layer non-uniform thickness transducers, two, two-layered non-uniform thickness transducers and a three-layered non-uniform thickness transducer. Listed on the right hand side of the table are three parameters namely; (a) the acoustic impedance Z at antiresonance for a single transducer element, (b) the clamping capacitance $\xi$ at 100 KHz for a single transducer element and (c) the round trip impulse response to flat target at center frequency for a single transducer element. Across the top line of the table is an indication of the array type and serial number of the array tested. The first two columns are for a single layer non-uniform thickness transducer having a design according to the '175 patent and the '998 patent. The next two columns are for a two-layered non-uniform thickness transducer having a design according to the '175 patent and the '998 patent. The last column is for a three-layered non-uniform thickness according to the present invention.

As an example, for a two-layer design an improvement of about 5½ db or better in signal-to-noise ratio has been measured and confirmed end for a three-layer design an improvement of about 8 db or better in signal-to-noise ratio has been measured and confirmed.

Figure 6:
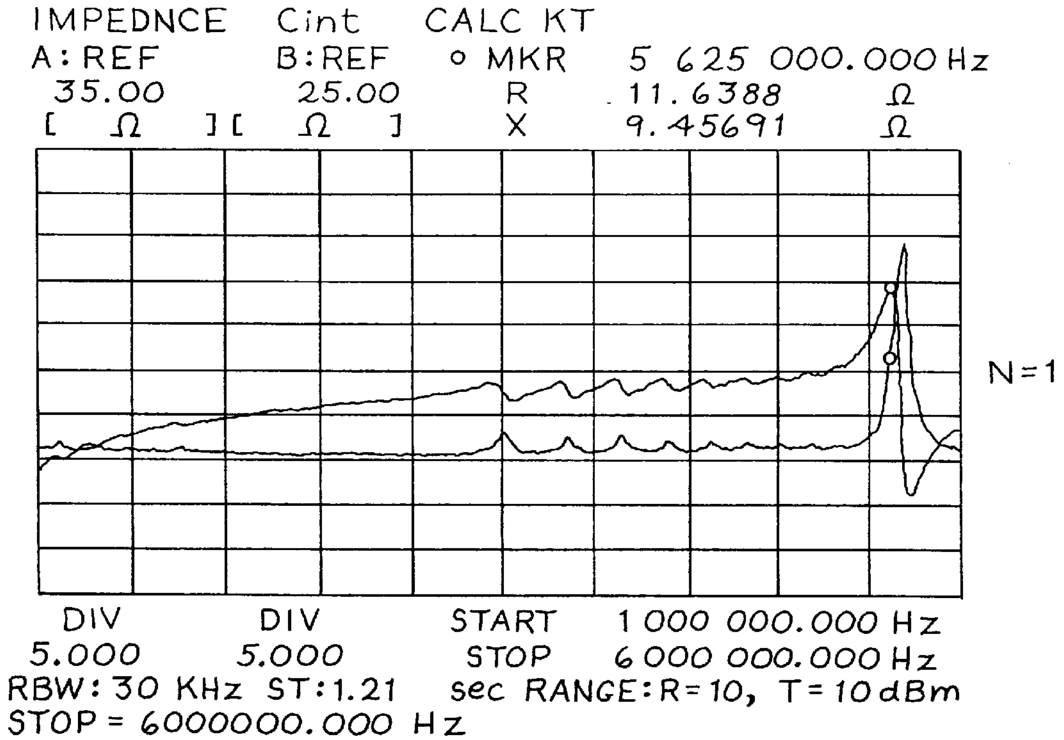
FIG. 6 is an example of a typical one-layer ultrasound transducer acoustic impedance frequency response plot resulting from operation of such transducer.

FIG. 6 is an example of a typical one-layer ultrasound transducer acoustic impedance frequency response plot resulting from operation of such transducer.

Figure 7:
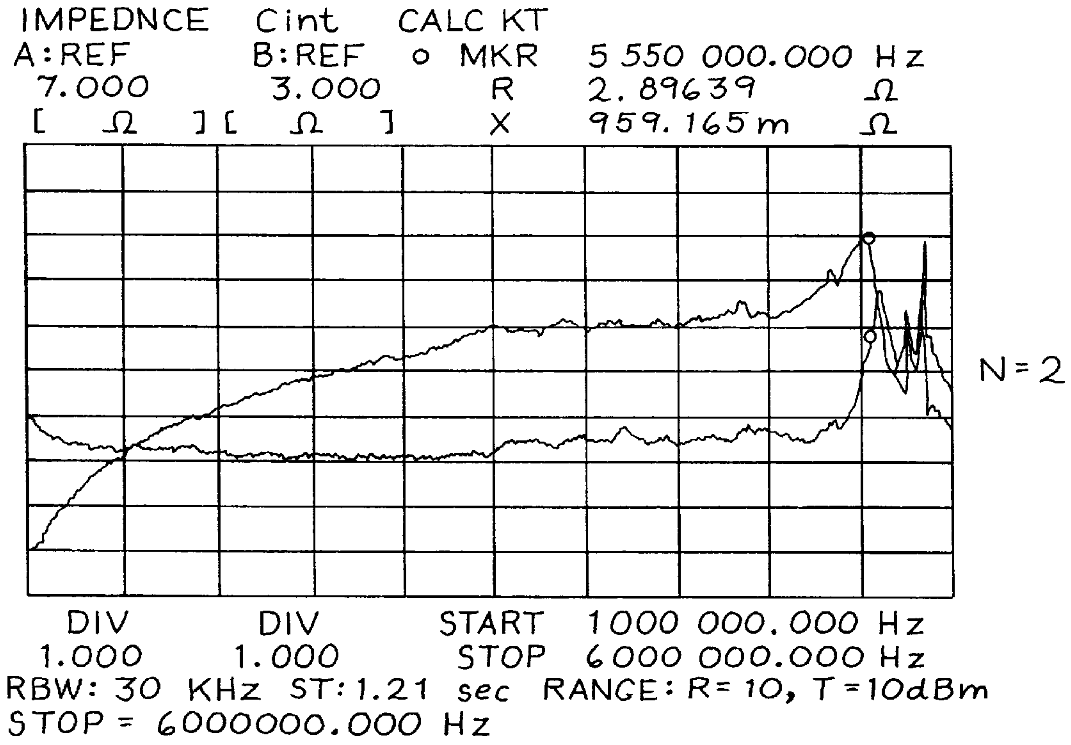
FIG. 7 is an example of a two crystal design ultrasound transducer acoustic impedance frequency response plot resulting from the operation of the two crystal transducer.

FIG. 7 is an example of a two crystal design ultrasound transducer acoustic impedance frequency response plot resulting from the operation of the two crystal transducer. Comparing the graphs shown in FIGS. 6 and 7 it can be seen that a reduction in anti-resonant frequency bulk impedance was reduced from 11.638 Ω to 2.896 Ω, a ratio of $4.018=N^2=2^2$.

While this invention has been shown and described in connection with the preferred embodiments, it is apparent that certain changes and modifications, in addition to those mentioned above, may be made from the basic features of the present invention. Accordingly, it is the intention of the Applicant to protect all variations and modifications within the true spirit and valid scope of the present invention.

What is claimed is:

1. A three crystal ultrasound transducer comprising:

a first piezoelectric layer having a thickness in a range direction and a width in an elevation direction wherein the width extends from a first end to a second end and the thickness of the first piezoelectric layer is at a maximum at the first and second ends and the thickness is at a minimum at a point about midway between the first and second ends;

a second piezoelectric layer disposed on the first piezoelectric layer, the second piezoelectric layer having a thickness in the range direction and a width in the elevation direction, wherein the width extends from a first end to a second end and the thickness of the second piezoelectric layer is at a maximum at the first and second ends and the thickness is at a minimum at a point about midway between the first and second ends;

a third piezoelectric layer disposed on the second piezoelectric layer, the third piezoelectric layer having a thickness in the range direction and a width in the elevation direction wherein the width extends from a first end to a second end and the thickness of the third piezoelectric layer is at a maximum at the first and second ends and the thickness is at a minimum at a point about midway between the first and second ends; and a signal flex circuit having a first conductive center pad and a second conductive center pad wherein the first and second conductive center pads are coupled together by a conductive area wherein the first conductive center pad is disposed between the first layer and the backing block and the second conductive center pad is disposed between the second and third piezoelectric layers and the conductive area wraps around an outer side wall of the first and second layers, the signal flex circuit also including a plurality of traces extending from the first conductive center pad.

2. An ultrasound transducer according to claim 1 wherein the first piezoelectric layer has a non-planar surface which faces a top surface of a backing block and an opposite, substantially planar surface; the second piezoelectric layer has a substantially planar surface which faces the substantially planar surface of the first piezoelectric layer and an opposite, non-planar surface; and the third piezoelectric layer has a first non-planar surface which faces the non-planar surface of the second piezoelectric layer and an opposite, non-planar surface which faces a region of examination when the ultrasound transducer is in use.

3. An ultrasound transducer according to claim 1 further comprising a ground flex circuit, the ground flex circuit has a first center pad disposed between the first and second piezoelectric layers and a second center pad disposed over the third piezoelectric layer.

4. An ultrasound transducer according to claim 3 wherein the ground interconnect circuit is split into a first branch and a second branch wherein the first branch includes the first center pad and the second branch includes the second center pad.

5. A. An ultrasound transducer according to claim 1 further comprising a first acoustic matching layer disposed on the third piezoelectric layer.

6. An ultrasound transducer according to claim 5 wherein the first acoustic matching layer has a thickness in the range direction and a width in the elevation direction wherein the thickness of the first acoustic matching layer is non-uniform along its width.

7. An ultrasound transducer according to claim 6 wherein the acoustic matching layer has a first end and a second end defining the width of the acoustic matching layer wherein the thickness of the acoustic matching layer is at a maximum at the first and second ends and the thickness is at a minimum at a point about midway between the first and second ends.

8. An ultrasound transducer according to claim 5 wherein the first acoustic matching layer has a concave surface which faces a region of examination when the ultrasound transducer is in use.

9. An ultrasound transducer according to claim 8 further comprising a second acoustic matching layer disposed on the first acoustic matching layer.

10. A three crystal ultrasound transducer comprising:

a first piezoelectric layer having a thickness in the range direction and a width in the elevation direction wherein the thickness of the first piezoelectric layer is non-uniform along its width;

a second piezoelectric layer disposed on the first piezoelectric layer, the second piezoelectric layer having a thickness in the range direction and a width in the elevation direction wherein the thickness of the second piezoelectric layer is non-uniform along its width;

a third piezoelectric layer disposed on the second piezoelectric layer, the third piezoelectric layer having a thickness in the range direction and a width in the elevation direction wherein the thickness of the third piezoelectric layer is non-uniform along its width, and a signal flex circuit having a first conductive center pad and a second conductive center pad wherein the first and second conductive center pads are coupled together by a conductive area wherein the first conductive center pad is disposed between the first layer and the backing block and the second conductive center pad is disposed between the second and third piezoelectric layers and the conductive area wraps around the outer side wall of the first and second layers, the signal flex circuit also including a plurality of traces extending from the first conductive center pad.

11. An ultrasound transducer according to claim 10 wherein each of the first, second and third piezoelectric layers has a first end and a second end defining the width of each layer wherein the thickness of each layer is at a maximum at the first and second ends and the thickness is at a minimum at a point about midway between the first and second ends.

12. An ultrasound transducer according to claim 10 wherein the third piezoelectric layer has a concave surface which faces a region of examination when the ultrasound transducer is in use.

13. An ultrasound transducer according to claim 10 further comprising an acoustic matching layer disposed on the third piezoelectric layer.

14. An ultrasound transducer according to claim 13 wherein the acoustic matching layer has a thickness in the range direction and a width in the elevation direction wherein the thickness of the acoustic matching layer is non-uniform along its width.

15. An ultrasound transducer according to claim 13 wherein the acoustic matching layer has a concave surface which faces a region of examination when the ultrasound transducer is in use.

16. An ultrasound transducer according to claim 14 wherein the acoustic matching layer has a first end and a second end defining the width of the acoustic matching layer wherein the thickness of the acoustic matching layer is at a maximum at the first and second ends and the thickness is at a minimum at a point about midway between the first and second ends.

17. A three crystal ultrasound transducer comprising:

a first piezoelectric layer;

a second piezoelectric layer disposed on the first piezoelectric layer;

a third piezoelectric layer disposed on the second piezoelectric layer; and a signal flex circuit having a first conductive center pad, a second center pad, and a conductive area coupling the first center pad and the second conductive center pad wherein the first conductive center pad is disposed between the first piezoelectric layer and a backing block and the second conductive center pad is disposed between the second and third piezoelectric layers and the conductive area wraps around an outer side wall of the first and second layers, the signal flex circuit also including a plurality of traces extending from the first conductive center pad.

18. An ultrasound transducer according to claim 17 wherein the first, second and third piezoelectric layers each have a thickness in a range direction and a width in an elevation direction wherein the thickness of each layer is non-uniform along its width.

19. An ultrasound transducer according to claim 18 wherein the width of each layer extends from a first end to a second end and the thickness of each layer is at a maximum at the first and second ends and the thickness of each layer is at a minimum at a point about midway between the first and second ends.

20. An ultrasound transducer according to claim 17 further comprising an acoustic matching layer disposed on the third piezoelectric layer.

21. An ultrasound transducer according to claim 20 wherein the acoustic matching layer has a thickness in a range direction and a width in an elevation direction wherein the thickness of each layer is non-uniform along its width.

22. An ultrasound transducer according to claim 21 wherein the width of the acoustic matching layer extends from a first end to a second end and the thickness of the acoustic matching layer is at a maximum at the first and second ends and the thickness of the acoustic matching layer is at a minimum at a point about midway between the first and second ends.

* * * * *

UNITED STATES PATENT AND TRADEMARK OFFICE

CERTIFICATE OF CORRECTION

PATENT NO. : 5,945,770
DATED : August 31, 1999
INVENTOR(S) : Amin M. Hanafy

It is certified that error appears in the above-identified patent and that said Letters Patent is hereby corrected as shown below:

In column 6, line 6, please change "KIM" to --KLM--.

In column 6, lines 10, 12, please insert --/-- between "(1) and "N" --.

Signed and Sealed this

Twentieth Day of February, 2001

*Attest:*

NICHOLAS P. GODICI

*Attesting Officer* *Acting Director of the United States Patent and Trademark Office*